US010366698B2

(12) United States Patent
Seroussi et al.

(10) Patent No.: US 10,366,698 B2
(45) Date of Patent: Jul. 30, 2019

(54) VARIABLE LENGTH CODING OF INDICES AND BIT SCHEDULING IN A PYRAMID VECTOR QUANTIZER

(71) Applicant: DTS, Inc., Calabasas, CA (US)

(72) Inventors: Gadiel Seroussi, Cupertino, CA (US); Alvaro Martin, Montevideo (UY)

(73) Assignee: DTS, Inc., Calabasas, CA (US)

( * ) Notice: Subject to any disclaimer, the term of this patent is extended or adjusted under 35 U.S.C. 154(b) by 99 days.

(21) Appl. No.: 15/611,362

(22) Filed: Jun. 1, 2017

(65) Prior Publication Data

US 2018/0061428 A1 Mar. 1, 2018

Related U.S. Application Data

(60) Provisional application No. 62/381,479, filed on Aug. 30, 2016.

(51) Int. Cl.
| | | |
|---|---|---|
| *G10L 19/038* | (2013.01) | |
| *G10L 19/002* | (2013.01) | |
| *H03M 7/30* | (2006.01) | |
| *G10L 19/00* | (2013.01) | |

(52) U.S. Cl.
CPC .......... *G10L 19/038* (2013.01); *G10L 19/002* (2013.01); *H03M 7/3082* (2013.01); *G10L 19/0017* (2013.01); *G10L 2019/0012* (2013.01)

(58) Field of Classification Search
CPC ................................... G10L 19/038
USPC ......................................... 704/500
See application file for complete search history.

(56) References Cited

U.S. PATENT DOCUMENTS

| | | | |
|---|---|---|---|
| 5,271,089 A | 12/1993 | Ozawa | |
| 5,781,561 A | 7/1998 | Machida et al. | |
| 6,240,385 B1 | 5/2001 | Foodeei | |
| 6,988,067 B2 | 1/2006 | Kim et al. | |
| 7,218,677 B2 | 5/2007 | Otsuka | |
| 7,539,612 B2* | 5/2009 | Thumpudi | G10L 19/035 704/200.1 |

(Continued)

FOREIGN PATENT DOCUMENTS

| | | |
|---|---|---|
| WO | WO-2018044897 A1 | 3/2018 |
| WO | WO-2018044897 A9 | 1/2019 |

OTHER PUBLICATIONS

Fischer, Thomas, "Pyramid Vector Quantizer", IEEE Transactions on Information Theory, vol. IT-32, No. 4., (Jul. 1986), 568-583.

(Continued)

*Primary Examiner* — Jakieda R Jackson
(74) *Attorney, Agent, or Firm* — Schwegman Lundberg & Woessner, P.A.

(57) ABSTRACT

Certain embodiments enable improved encoding and decoding of a vector of coefficients by associating a vector element of a signed pyramid with an encoded value that includes a first portion and a second portion, where the first portion identifies a corresponding vector element of an unsigned pyramid and a second portion characterizes sign values for nonzero components of the vector element of the signed pyramid. As a result, computational constraints such as word size apply to the unsigned pyramid instead of the signed pyramid. The smaller size of the unsigned pyramid enables extending the range of signed pyramid parameters that are operable within the computational constraints.

20 Claims, 11 Drawing Sheets

(56) References Cited

U.S. PATENT DOCUMENTS

| | | | |
|---|---|---|---|
| 7,889,103 B2* | 2/2011 | Mittal | H03M 7/3082 |
| | | | 341/107 |
| 8,175,888 B2* | 5/2012 | Ashley | G10L 19/24 |
| | | | 704/500 |
| 9,009,036 B2 | 4/2015 | Valin et al. | |
| 9,015,052 B2 | 4/2015 | Lin et al. | |
| 9,245,532 B2 | 1/2016 | Gournay et al. | |
| 2005/0285764 A1 | 12/2005 | Bessette et al. | |
| 2012/0128064 A1 | 5/2012 | Sato | |
| 2012/0259644 A1 | 10/2012 | Lin et al. | |
| 2013/0132100 A1 | 5/2013 | Sung et al. | |
| 2014/0025375 A1 | 1/2014 | Norvell | |
| 2014/0358978 A1* | 12/2014 | Valin | H03M 7/3082 |
| | | | 708/201 |
| 2016/0027449 A1 | 1/2016 | Svedberg | |
| 2016/0088297 A1* | 3/2016 | Svedberg | G10L 19/00 |
| | | | 375/240.03 |
| 2016/0093311 A1 | 3/2016 | Kim et al. | |
| 2018/0060023 A1 | 3/2018 | Nemer et al. | |

OTHER PUBLICATIONS

Valin, Jean-Marck, et al., "A HIgh-Quality Speech and Audio Codec with Less Than 10-ms Delay", IEEE Transactions on Audio, Speech, and Language Processing, vol. 18, No. 1., (Jan. 2010), 58-67.

"International Application Serial No. PCT/US2017/049130, International Search Report dated Dec. 26, 2017", 2 pgs.

"International Application Serial No. PCT/US2017/049130, Written Opinion dated Dec. 26, 2017", 10 pgs.

* cited by examiner

| $n$ | $k$ | $\|S(n,k)\|$ | $\lceil\log\|S(n,k)\|\rceil$ | $\|P(n,k)\|$ | $\lceil\log\|P(n,k)\|\rceil$ |
|---|---|---|---|---|---|
| 20 | 10 | 3339504032 | 32 | 20030010 | 25 |
| 20 | 11 | 12798246520 | 34 | 54627300 | 26 |
| 20 | 12 | 45443741760 | 36 | 141120525 | 28 |
| 20 | 13 | 150056183240 | 38 | 347373600 | 29 |
| 20 | 14 | 469398016480 | 39 | 818809200 | 30 |
| 20 | 15 | 1382229673088 | 41 | 1855967520 | 31 |
| 20 | 16 | 3866465104640 | 42 | 4059928950 | 32 |

FIG. 1

| n | b | C0(n) | C1(n) | $\lfloor \hat{K}(n,b) \rfloor$ |
|---|---|---|---|---|
| 8 | 36 | 118/512 | 751/512 | 51 |
| 16 | 42 | 1637/512 | 1762/512 | 20 |

FIG. 2

VARIABLE LENGTH CODING OF INDICES AND BIT SCHEDULING IN A PYRAMID VECTOR QUANTIZER

CROSS-REFERENCE TO RELATED APPLICATIONS

This application claims the benefit of U.S. Provisional Application No. 62/381,479, filed Aug. 30, 2016, which is incorporated herein by reference in its entirety.

BACKGROUND

The transmission of high-resolution signals typically includes data compression and recovery via codec devices for encoding and decoding the data stream before and after transmission. Requirements for faster speeds and higher resolutions (e.g., real time audio and video) have created a need for improved encoding and decoding of data signals generally and, in particular, for high resolution signals. Conventional approaches have been limited in their capacity to accommodate these requirements in many practical applications where the resolution requirements can result in unacceptably slow speeds.

SUMMARY

Certain embodiments enable improved encoding and decoding of a vector of coefficients by associating a vector element of a signed pyramid with an encoded value that includes a first portion and a second portion, where the first portion identifies a corresponding vector element of an unsigned pyramid and a second portion characterizes sign values for nonzero components of the vector element of the signed pyramid. As a result, computational constraints such as word size apply to the unsigned pyramid instead of the signed pyramid. The smaller size of the unsigned pyramid enables extending the range of signed pyramid parameters that are operable within the computational constraints.

One embodiment relates to a method of processing audio signals. A first operation includes accessing an input audio signal from an audio source. A second operation includes encoding the input audio signal by determining a plurality of encoded values. An encoded value of the plurality of encoded values includes a first portion and a second portion, the first portion including an index to an element of an unsigned pyramid that is defined by a vector size and a quantization parameter, and the second portion including a corresponding sign value for each nonzero component of the element of the unsigned pyramid. A third operation includes decoding the encoded values in accordance with the encoding of the input audio signal to generate an output audio signal. A fourth operation includes providing the output audio signal to an audio player. Additional operations related to data transmission of the encoded values may be included between the second operation for encoding and the third operation for decoding.

Another embodiment relates to an apparatus for carrying out any one of the above-described methods, where the apparatus includes a computer for executing instructions related to the method. For example, the computer may include a processor for executing at least some of the instructions. Additionally or alternatively the computer may include circuitry or other specialized hardware for executing at least some of the instructions. In some operational settings, the apparatus may be configured as a system that includes one or more units, each of which is configured to carry out some aspects of the method either in software, in hardware or in some combination thereof. At least some values for the results of the method can be saved for later use in a computer-readable medium, including memory units and storage devices. Another embodiment relates to a computer-readable medium that stores (e.g., tangibly embodies) a computer program for carrying out the any one of the above-described methods with a computer. In these ways, aspects of the disclosed embodiments enable improved coding and decoding of signals in a variety of operational settings and provide improvements in computer-related technology in response to increasing requirements for faster speeds and higher resolutions.

BRIEF DESCRIPTION OF DRAWINGS

Certain embodiments are illustrated by way of example and not limitation in the figures of the accompanying drawings.

FIG. 1 is a table that shows sizes of signed and unsigned pyramids for vector size n=20 and various values of the quantization parameter k.

FIG. 2 is a table that shows example values of lower integral bounds for selected values of vector size n and the quantization parameter k.

DETAILED DESCRIPTION

Figure 3:
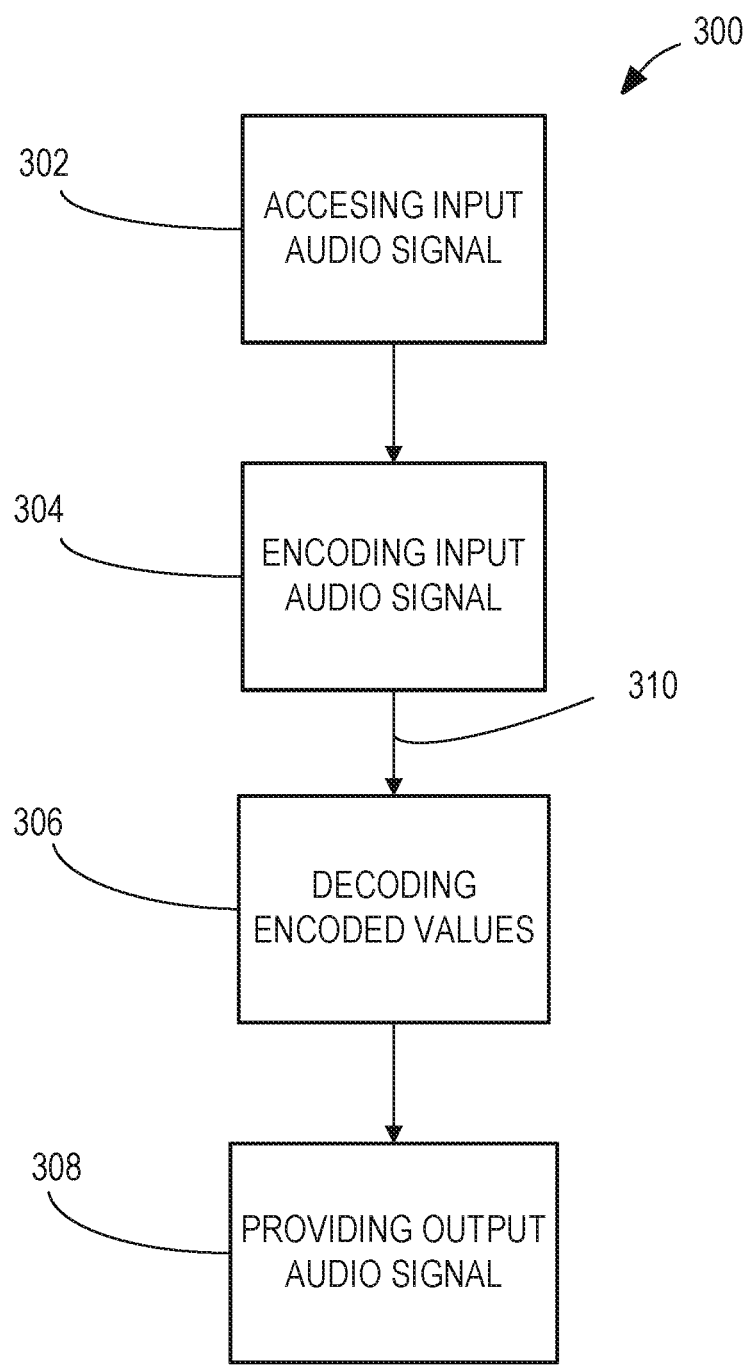
FIG. 3 is a flowchart that shows a method of processing audio signals according to an example embodiment.

The description that follows includes systems, methods, techniques, instruction sequences, and computer-program products that illustrate embodiments of the present disclosure. In the following description, for purposes of explanation, numerous specific details are set forth in order to provide an understanding of various embodiments of the disclosed subject matter. It will be evident, however, to those skilled in the art that embodiments of the disclosed subject matter may be practiced without these specific details. In general, well-known instruction instances, protocols, structures and techniques have not been shown in detail.

1. Pyramid Vector Quantizers

For positive integers n; k, the signed pyramid $S(n, k)$ denotes the subset of vectors from $\mathbb{Z}^n$ whose $L_1$ norm equals k, where $\mathbb{Z}$ denotes the set of integers:

$$S(n,k)=\{(y_1, \ldots, y_n)\in\mathbb{Z}^n: \Sigma_{i=1}^n |y_i|=k\}. \quad (1)$$

A pyramid vector quantizer (PVQ) maps vectors in $\mathbb{R}^n$, where $\mathbb{R}$ denotes the set of real numbers, to vectors in $S(n, k)$, for some positive integer k, the quantization parameter that characterizes the quantizer resolution. In a conventional coding application, a vector $x \in \mathbb{R}^n$ is quantized to a vector $y \in S(n, k)$, and this quantized vector is then encoded and transmitted to a decoder, where the process is reversed.

One way to encode the quantized vector y is to enumerate the set $S(n, k)$, that is, order its elements, so that each vector $y \in S(n, k)$ has a unique index $I_S(y)$, $0 \le I_S(y) < |S(n, k)|$, where $|S|$ denotes the cardinality of the set S. Then, to encode y, its index $I_S(y)$ is transmitted. On the receiving side, the decoder, using the same enumeration, reconstructs y from its index. For a practical application, the enumeration should be efficiently computable so that for a given vector), its index $I_S(y)$ can be computed efficiently, and conversely for a given index $I_S(y)$, the corresponding vector y can be computed efficiently. Such efficient enumerations of $S(n, k)$ are known to those skilled in the art of coding for a PVQ. The encoding of the index itself can be accomplished, for example, by using a fixed-length code with the binary representation of $I_S(y)$ in $\lceil \log|S(n, k)| \rceil$ bits (i.e., the upper integral bound of the base-2 logarithm). Alternatively, a somewhat more efficient encoding can be accomplished by using an optimal two-length code, with some indices being coded in $\lceil \log|S(n, k)| \rceil$ bits and the remaining indices being coded in $\lfloor \log|S(n, k)| \rfloor$ bits (i.e., the lower integral bound of the base-2 logarithm), where this approach assumes a uniform probability distribution on the vectors in $S(n, k)$).

The enumeration algorithms involve arithmetic operations on integers of size roughly $\log|S(n, k)|$. In an efficient computer implementation, one would prefer to have these integers fit in the natural word size, in, of the processor in use (e.g., m=32 or m=64 bits). This places a constraint on the feasible parameters n, k of the PVQ so that $\log|S(n, k)| \le m$. In practical applications, it is often the case that a relatively long vector needs to be quantized and encoded, for which one has a given budget of bits B. If B>m this cannot be done in one encoding, since a pyramid of size $2^B$ is too large for a single encoding. A common solution is to partition the vector into two halves, and divide the budget between the two halves (not necessarily in equal parts), as in for example B=B1+B2−c, where c denotes the possible cost of describing the budget allocation or other properties of the partition to the decoder. One can then attempt the quantization/encoding on each of the halves, and the process can be continued recursively until the budget $b_i$ for each part of the vector to be encoded satisfies $b_i \le m$.

2. Variable Length Encoding

As discussed below in detail, certain embodiments are based on an alternative coding process that relaxes the above constraints on n and k, thereby allowing for pyramids of sizes that can be larger than $2^m$ so that the number of splits can be reduced in the above-described recursive subdivision process. For positive integers n, k, the unsigned pyramid $P(n, k)$ denotes the subset of vectors in $S(n, k)$ whose components are all nonnegative:

$$P(n,k)=\{(y_1, \ldots, y_n)\in\mathbb{Z}^n: y_i \ge 0, 1 \le i \le n, \Sigma_{i=1}^n |y_i|=k\}. \quad (2)$$

As described below, the encoding of a vector $y \in S(n, k)$ can be performed in two steps resulting in two portions.

In the first step, one determines the corresponding vector $y' \in P(n, k)$, defined as $y_i' = |y_i|$, $1 \le i \le n$. Then one finds and encodes the corresponding index $I_P(y')$ in an enumeration of $P(n, k)$. With the assumption of a uniform distribution of vectors in $P(n, k)$, this requires $l(y')$ bits, where $l(y')$ satisfies $\lfloor \log|P(n, k)| \rfloor \le l(y') \le \lceil \log|P(n, k)| \rceil$. The first portion of the encoded vector is the index $I_P(y')$.

In the second step, the sign of each nonzero component (e.g., entry) of y can be characterized by a 1-bit code. The second portion of the encoded vector is a characterization of these signs, possibly a simple encoding utilizing one bit per sign (e.g., '0' representing '+', '1' representing '−').

To perform the first step, one can use a conventional enumeration of $P(n, k)$, which is generally much smaller than $S(n, k)$. The constraint on the sizes of the integers operated on becomes $\log|P(n, k)| \le m$, which is less stringent than the constraint $\log|S(n, k)| \le m$.

The second portion of the encoding from the second step is relatively small, requires no arithmetic operations, and is not subject to any particular limitation. The length of this part however can vary from 1 bit up to min(n, k) bits, depending on the number of nonzero components in y, which is assumed to be nonzero. As a result, this portion of the encoding may have a variable length as compared to conventional methods that employ a fixed-length encoding.

The table in FIG. 1 shows values of $|P(n, k)|$ and $|S(n, k)|$ for vector size n=20 and various values of the quantization parameter k. As illustrated by the values of the table, conventional methods based on an enumeration of $S(n, k)$ are limited to k=10 in a 32-bit machine, while the above-described two-step method allows values of the quantization parameter k up to 16 for a 32-bit machine. By comparison, the table shows that conventional methods would require operations on 42-bit integers for k=16, and consequently the vectors would require splitting as part of the coding process at that quantization level.

In addition to the above-described advantage in extending the range of feasible parameters for the PVQ, it should be noted that $P(n, k)$ is a simpler combinatorial object as compared with $S(n, k)$ and so the corresponding enumeration algorithms are therefore also simpler. As discussed below, elements of $P(n, k)$ can be identified with combinations of (n+k−1) elements taken (n−1) at a time.

3. Quantization Levels for Encoding

In a typical high-resolution coding application with an m-bit machine, one is given a budget b of bits and a vector x of length n to quantize and encode with the largest available quantization parameter k for a high-level quantization. In the case of the above-described conventional method based on an enumeration of $S(n, k)$ with a fixed-length encoding, if $b \le m$ then one finds the largest value of k that satisfies $|S(n, k)| \le 2^b$. If b>m, then the vector can be split as described above.

For embodiments based on a variable-length encoding as described above, the code length may depend strongly on x, and so different quantization levels may be possible for a given bit budget b and different values of x. Alternatively, one can focus on finding the quantization level corresponding to the parameter k so that the bound is achieved on average (e.g., over many coding operations uniformly sampled from possible vectors x). That is, the actual bit consumption may be above or below the set budget for individual cases so long as the long-term average satisfies the budget.

For certain embodiments the quantization parameter k can be determined for a given vector length n by evaluating an expected code length so that the value of k yields an expected code length that is relatively (or optimally) close to the bit budget b. With the assumption that all vectors in S(n, k) are equally likely, the expected code length is bounded above by $L_k$, defined as $$L_k = \lceil \log |P(n,k)| \rceil + n - Z(n,k), \quad (3)$$

where Z(n,k) is the expected number of zero components in a vector selected randomly from P(n,k).

For the evaluation of this formula for $L_k$, the number of vectors in P(n, k) is $$|P(n, k)| = \binom{n+k-1}{n-1}. \quad (4)$$

For example, (n+k−1) elements mark locations of boundaries between vector elements plus locations of unitary contributions to the vector elements with one vector element boundary fixed to start (e.g., left-most or right-most). Then locations for (n−1) additional boundaries for the vector elements can be chosen from the (n+k−1) possible locations.

The value of Z(n,k) is $$Z(n, k) = \sum_{j=\max\{0,n-k\}}^{n-1} \frac{j\binom{n}{j}|P(n-j, k-n+j)|}{|P(n, k)|}. \quad (5)$$

In the above formula for Z(n,k), the factor $\binom{n}{j}$ is the number of different choices for j zero components and |P(n−j,k−n+j)| is the number of strictly positive integer vectors of dimension (n−j) with components summing to k.

The above-described formulas can be used to derive expressions that determine the optimal (or nearly optimal) quantization parameter k for a given vector size n and bit budget b. For integers n, b greater than 1, the function K(n, h) is defined as the value of k such that $\lceil L_k \rceil$ is closest to b, with ties broken in favor of the larger value of k. In some operational settings, a pre-determined estimate for this function can be stored for convenient access. For example, certain embodiments include the following functional form for an approximation to the optimal value of k:

$$\hat{K}(n, b) = -c_0(n) + c_1(n)2^{\frac{b}{n-1}}, \quad (6)$$

where the coefficients $c_0(n)$ and $c_1(n)$ can be obtained through a least-squares fit for an approximation to K(n, b) over a range of relevant values. This approximation enables an efficient evaluation of the quantization parameter k for given values of the vector length n and bit budget b. FIG. 2 shows a table that includes example values of the lower integral bound $\lfloor \hat{K}(n, b) \rfloor$ for selected values of n and b. As discussed above with respect to the table of FIG. 1, this enables a higher quantization level for a given bit budget over an average of encodings.

4. Method Embodiments

Although certain embodiments are described here with reference to audio signals, those skilled in the art of data processing will appreciate the extensions to alternative data sets (e.g., video signals). FIG. 3 show a method 300 of processing audio signals according to an example embodiment. A first operation 302 includes accessing an input audio signal from an audio source (e.g., via a microphone).

A second operation 304 includes encoding the input audio signal to determine encoded values. An encoded value includes a first portion and a second portion, the first portion including an index to an element of an unsigned pyramid that is defined by a vector size and a quantization parameter, and the second portion including a corresponding sign value for each nonzero component of the element of the unsigned pyramid.

A third operation 306 includes decoding the encoded values in accordance with the encoding of the input audio signal to generate an output audio signal. A fourth operation 308 includes providing the output audio signal to an audio player (e.g., including an output speaker). As discussed below, optional operations 310 related to data transmission are typically performed between the encoding operation 304 and the decoding operation 306.

The unsigned pyramid is typically defined as in Eq. 2. That is, the unsigned pyramid includes a plurality of vectors of the vector size, and each of the plurality of vectors of the unsigned pyramid has non-negative integral vector elements with a sum of the non-negative integral vector elements being equal to the quantization parameter. As discussed above with respect to Eq. 2, the first portion of the encoded value may include a first sequence of bits, a length of the first sequence being selected from one or more values based on a size of the unsigned pyramid. As discussed above, this length may be a fixed length based on the size of the unsigned pyramid or varied somewhat to minimize or reduce the number of bits as in the optimal two-length code discussed above. Further, the second portion of the encoded coefficient may include a second sequence of bits, a variable length of the second sequence being based on the number of nonzero components of the vector encoded in the first sequence. That is, the unsigned-pyramid element identified from the first portion includes a number of nonzero components whose sign values (plus or minus) are identified from the second portion in order to recover the corresponding signed-pyramid element.

The related signed pyramid is typically defined as in Eq. 1. That is, the related signed pyramid includes a plurality of vectors of the vector size, and each of the plurality of vectors of the signed pyramid has integral vector elements with a sum of magnitudes of the integral vector elements being equal to the quantization parameter.

As described by Eq. 1 and Eq. 2, each element of the unsigned pyramid can be identified with an element of the signed pyramid by taking absolute values (i.e., magnitudes) of the vector elements. In this way, an element of the signed pyramid can be encoded by a first portion that identifies a corresponding element of the unsigned pyramid and a second portion that accounts for the omitted sign values of the vector elements. It should be noted that words such as first and second are used here and elsewhere for labeling purposes only and are not intended to denote any specific spatial or temporal ordering. Furthermore, the labeling of a first element does not imply the presence of a second element.

Although the embodiment of FIG. 3 discloses operations from an input audio signal to an output audio signal, related embodiments may be specifically focused on the operation 304 for encoding or the operation 306 for decoding.

Figure 4:
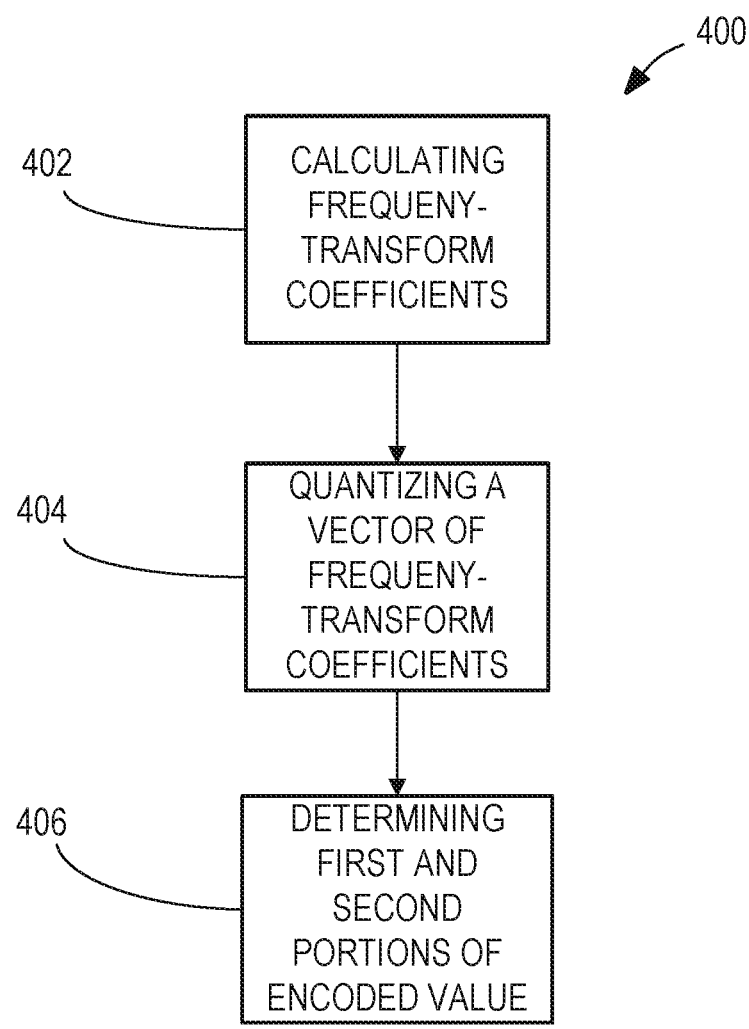
FIG. 4 is a flowchart that shows a method of encoding an input audio signal by determining an encoded value according to an example embodiment related to the method of FIG. 3.

FIG. 4 shows a method 400 of encoding the input audio signal by determining an encoded value according to an example embodiment (e.g., as in operation 304 of FIG. 3). A first operation 402 includes calculating frequency-transform coefficients based on an application of the input audio signal to a Modified Discrete Cosine Transform (MDCT). For example, the vector size of the unsigned pyramid may correspond to a frequency dimension of the MDCT or to a portion of the frequency dimension (e.g., if some frequency components are ignored or combined with other frequency components, or if the full MDCT spectrum is partitioned into shorter vectors).

A second operation 404 includes quantizing a vector of the frequency-transform coefficients with the quantization parameter to determine elements of a signed pyramid (e.g., Eq. 1) that is defined by the vector size and the quantization parameter. That is, the frequency components may be combined (e.g., via partitioning), scaled, and mapped to integral values so that the sum of the integral vector elements is equal to the quantization parameter, which is also an integer value. For example, based on a real-valued vector (e.g., the vector of scaled frequency components), the mapping may determine an optimally close or sufficiently close integer-valued vector. A third operation 406 includes determining the first portion and the second portion of the encoded value from the element of the signed pyramid, where the first portion identifies a corresponding element of the unsigned pyramid (e.g., Eq. 2) and the second portion characterizes sign values for nonzero components of the element of the signed pyramid (e.g., Eq. 1). Similar operations may be carried out for determining each encoded value in the encoding operation 304, where different pyramids may be used depending for example on the partitioning of the frequency spectrum and the relevant bit budgets for portions of the frequency spectrum.

Figure 5:
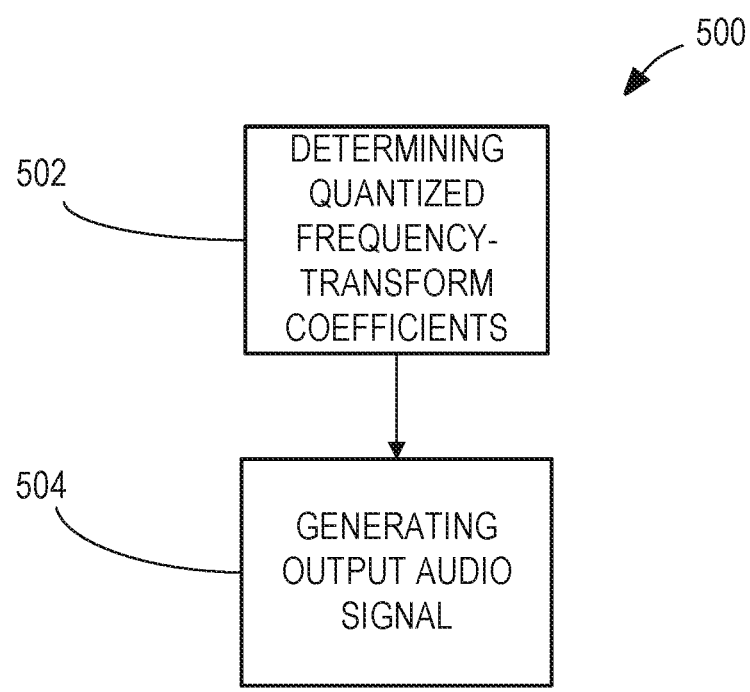
FIG. 5 is a flowchart that shows a method of decoding the encoded values according to an example embodiment related to the method of FIG. 3.

FIG. 5 shows a method 500 of decoding the encoded values according to an example embodiment (e.g., as in operation 306 of FIG. 3). A first operation 502 includes determining quantized frequency-transform coefficients from the encoded values. For example, for the encoded value discussed above with respect to FIG. 4, the corresponding quantized frequency-transform coefficients are determined by using the first and second portions of the encoded value to identify an element of a signed pyramid (e.g., Eq. 1) that corresponds to the unsigned pyramid (e.g., Eq. 2) for the vector size and quantization parameter, where the identified element of the signed pyramid includes sign values that are identified from the second portion of the encoded value. A second operation 504 includes generating the output audio signal from the quantized frequency-transform coefficients. This second operation 504 includes a reversal of the scaling operation discussed above with respect to operation 404 of FIG. 4, so that the relevant scaling factor (or norm of the encoded vector) is generally made accessible for this step.

In general, the decoding operation 306 is consistent with the encoding operation 304 so that the output audio signal is an approximation relative to the quantization parameter and the vector size for the input audio signal. That is, the operations related to the decoding include a reversal of the operations related to the encoding in accordance with the vector size and the quantization parameter.

Figure 6:
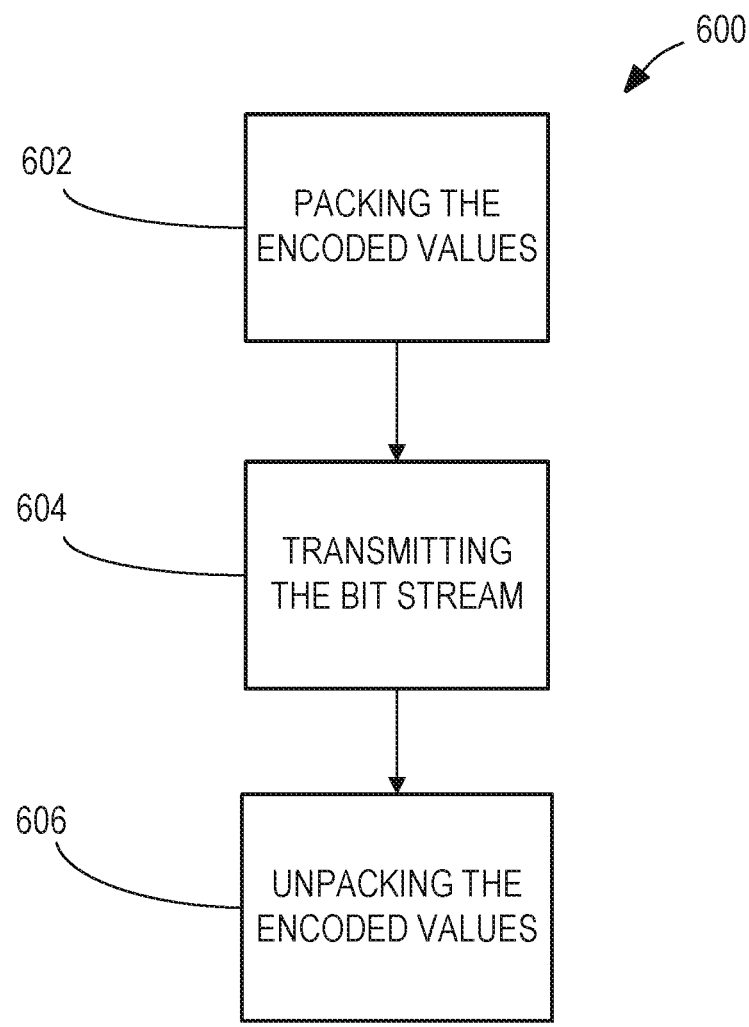
FIG. 6 is a flowchart that shows a method that includes optional operations related to data transmission between the encoding operation and the decoding operation of FIG. 3 according to an example embodiment.
Figure 7:
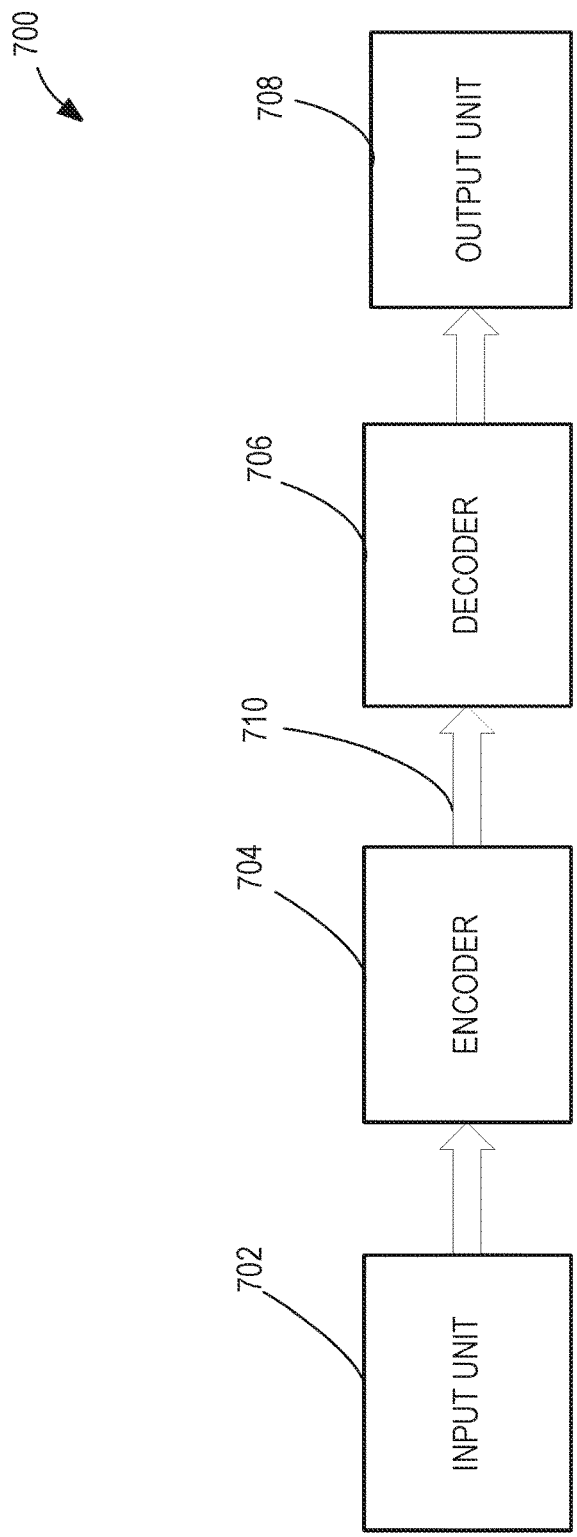
FIG. 7 is a diagram that shows a system for processing audio signals according to an example embodiment related to the embodiment of FIG. 3.

As noted above, operations 310 related to data transmission are typically performed between the encoding operation 304 and the decoding operation 306. FIG. 6 shows a method 600 that includes optional operations related to data transmission (e.g., operations 310 of FIG. 3) between the encoding operation 304 and the decoding operation 306. A first operation 602 includes packing the encoded values into a bitstream at a first location that is associated with the encoding. A second operation 604 includes transmitting the bitstream from the first location that is associated with the encoding to a second location that is associated with the decoding. A third operation 606 includes unpacking the encoded values from the bitstream at the second location that is associated with the decoding. System Embodiments System embodiments related to the above-described method embodiments may range in complexity depending on the requirements of the operational setting. FIG. 7 shows a system for processing audio signals in accordance with the method 300 of FIG. 3. An input unit 702 is configured to access an input audio signal from an audio source. An encoder 704 includes one or more processors configured to perform operations including: encoding the input audio signal to determine encoded values, the encoded values each including a first portion and a second portion, the first portion including an index to an element of an unsigned pyramid that is defined by a vector size and a quantization parameter, and the second portion characterizing a sign value for each nonzero component of the element of the unsigned pyramid. A decoder 706 includes one or more processors configured to perform operations including: decoding the encoded values in accordance with the encoding of the input audio signal to generate an output audio signal. An output unit 708 is configured to provide the output audio signal to an audio player.

Similarly as discussed above with respect to FIG. 6, additional hardware units 710 for data transmission may be included between the encoder 704 and the decoder 706 for operations related to transmitting a bitstream associated with the encoded values from a first location that is associated with the encoder 704 to a second location that is associated with the decoder 706. Similarly, additional hardware elements may be associated with the audio source for the input audio signal that is accessed by the input unit 702 and the audio player that is provided with the output audio signal by the output unit 708.

Although the embodiment of FIG. 7 discloses structural units between an input audio signal to an output audio signal, related embodiments may be specifically focused on the encoder 704 or the decoder 706.

Figure 8:
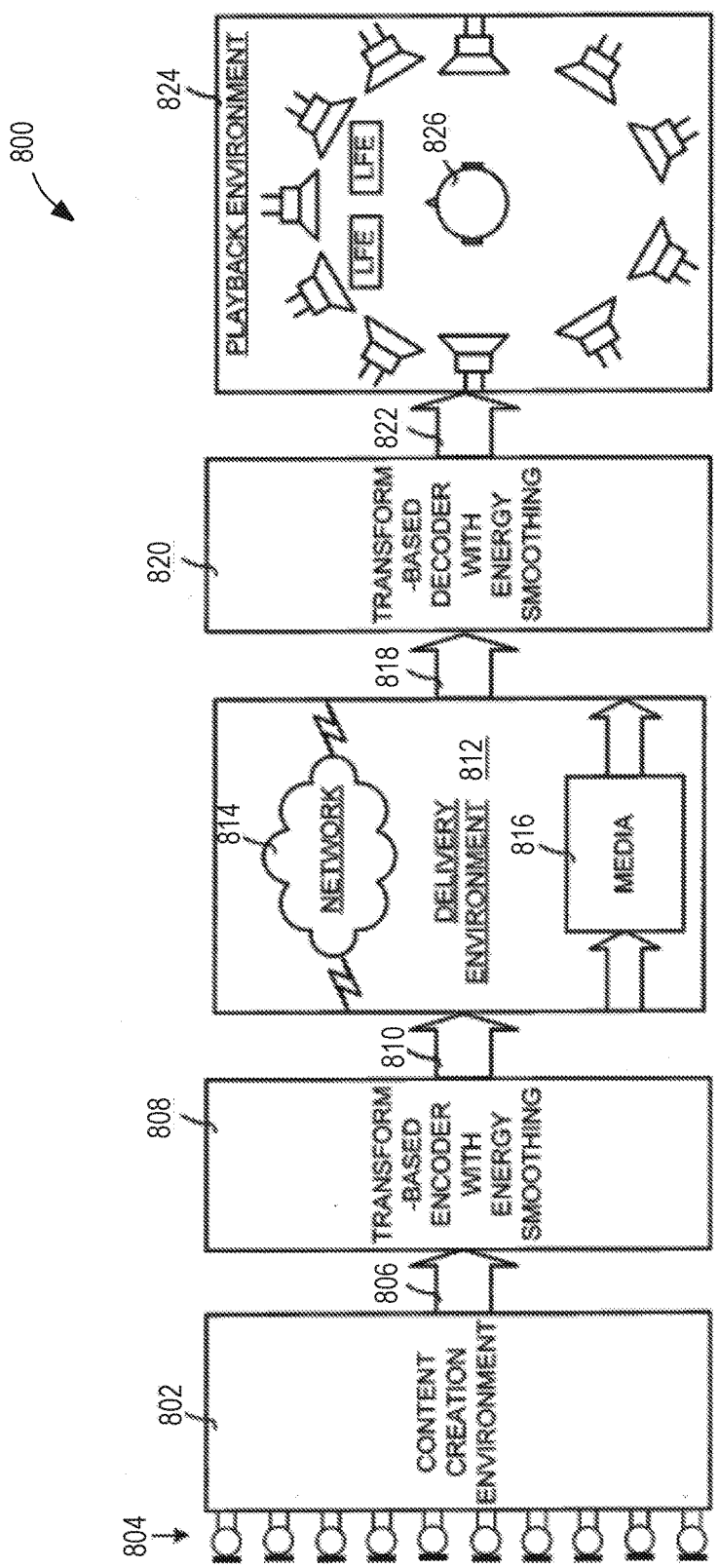
FIG. 8 is a diagram that shows another system for processing audio signals according to a example embodiment related to the embodiment of FIG. 3.

FIG. 8 shows a more detailed system 800 for processing audio signals according to an example embodiment that includes a transform-based codec with energy smoothing. As discussed below, the system 800 of FIG. 8 can be understood as a more specific version of the system 700 of FIG. 7.

Initially, audio content (such as musical or vocal tracks) is created in a content creation environment 802 (e.g., corresponding to the input unit 702 of FIG. 7). This environment 802 may include a plurality of microphones 804 (or other sound-capturing devices) to record audio sources. Alternatively, the audio sources may already be a digital signal such that it is not necessary to use a microphone to record the source. Whatever the method of creating the sound, the output of the content creation environment 802 is an audio signal 806 (e.g., represented in some analog format).

The audio signal 806 then is encoded via a transform-based encoder with energy smoothing 808 (e.g., corresponding to the encoder 704 of FIG. 7). The encoder 808 is typically located on a computing device having one or more processing devices. The encoder 808 encodes the audio signal 806 to generate an encoded bitstream 810.

The encoded bitstream 810 is delivered for consumption by a listener through a delivery environment 812 (e.g., corresponding to the hardware units 710 for data transmission of FIG. 7). Several delivery options are available, including streaming delivery over a network 814. Alternatively, the encoded bitstream 810 is stored on a media 816 (e.g., an optical disk) for consumption by the listener. In addition, there are many other delivery options not enumerated here that may be used to deliver the encoded bitstream 810.

The output of the delivery environment 812 is a transmitted encoded bitstream 818 that is input to a transform-based decoder with energy smoothing 820 (e.g., corresponding to the decoder 706 of FIG. 7). The decoder 820 decodes the transmitted encoded bitstream 818 to obtain a recovered audio signal 822. Embodiments of the decoder 820 are typically located on a computing device having one or more processing devices. The recovered audio signal 822 is reproduced in a playback environment 824 that includes a playback speaker (or channel) layout (e.g., corresponding to the output unit 708 of FIG. 7). The playback speaker layout may or may not be the same as the content creation speaker layout. The playback speaker layout shown in FIG. 8 is an 11.2 layout and the environment 824 includes a listener 826. In other embodiments, the playback speaker layout may include headphones such that the speakers are merely virtual speakers from which sound appears to originate in the playback environment 824. For example, the listener 826 may be listening to the recovered audio signal 822 through headphones. In this situation, the speakers are not actual physical speakers (except for the headphones), but sounds appear to originate from different spatial locations in the playback environment 824 corresponding, for example, to an 11.2 surround sound speaker configuration.

Figure 9:
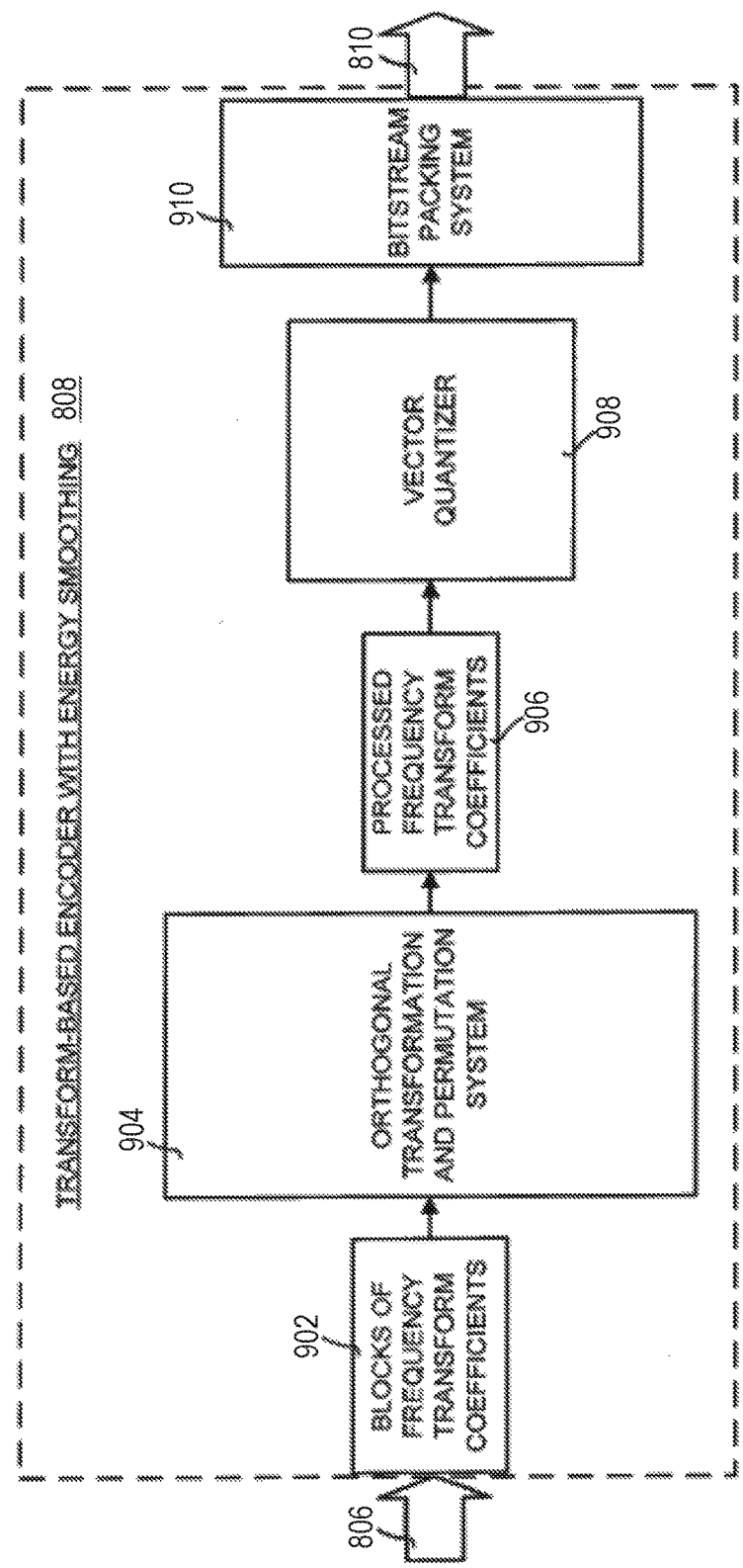
FIG. 9 is a diagram that shows further details for an embodiment of the encoder of FIG. 8.

FIG. 9 shows further details for the transform-based encoder with energy smoothing 808 of FIG. 8 for an example embodiment. (Note that energy smoothing may be optional for some embodiments.) As shown FIG. 9, blocks of frequency transform coefficients 902 are extracted from the audio signal 806 (e.g., via a frequency-transform circuit). These coefficients 902 are input to an orthogonal transformation and permutation system 904 that generates processed frequency transform coefficients 906 (e.g., via a coefficient-processing circuit). The processed frequency transform coefficients 906 are then processed by a vector quantizer 908 (e.g., a quantizer circuit). The outputs (e.g., encoded values) of the vector quantizer 908 are processed by a bitstream packing system 910 (e.g., a bitstream-packing circuit) that generates the encoded bitstream 810.

The blocks of frequency transform coefficients 902 may be MDCT coefficients extracted from the audio signal 806 via MDCT processing as described above with reference to FIG. 4. The orthogonal transformation and permutation system 904 may combine coefficients from separate frequency bands into vectors of processed frequency transform coefficients 906 for separate processing by the vector quantizer 908. The orthogonal transformation and permutation system 904 may also employ energy smoothing within frequency bands as described in U.S. application Ser. No. 15/253,646, which is referenced below in greater detail.

In this context, it should be noted that the partitioning of frequency bands into separate frequency segments for separate processing by the vector quantizer 908 typically has a significant impact on the overall computational expense, which depends on the number of vector quantizations required to represent the audio signal. As discussed above with respect to FIG. 1, disclosed embodiments enable fewer quantizations to represent an audio signal since elements of larger-sized pyramids representing larger frequency segments can be encoded at each step. That is, more information can be encoded in each quantization so that fewer quantizations are needed overall to represent the audio signal. For example, in computational embodiments representing typical audio applications, a reduction of 5-25% was found in the number of quantizations required to represent the audio signal as compared with conventional methods. Typically, the number of partitions and quantizations increases with the total number of bits available for the encoding, and, therefore, with the quality of the reconstructed signal. In typical embedded applications (e.g., an audio decoder embedded in a digital TV set), the computational budget (number of CPU cycles per second) available for decoding audio is strictly limited. Consequently, the disclosed embodiments allow for a higher quality reconstruction for a given computational budget. That is, the disclosed embodiments enable improvements in computer-related technology in response to the increasing requirements of audio processing so that higher resolution signals can be processed without compromising the requirements for speed.

The vector quantizer 908 then may then determine the encoded values for the processed frequency-transform coefficients 906 in accordance with the second operation 302 of FIG. 3. The bitstream packing system 910 may then determine the encoded bitstream 810 in accordance with the first operation 602 of FIG. 6.

Figure 10:
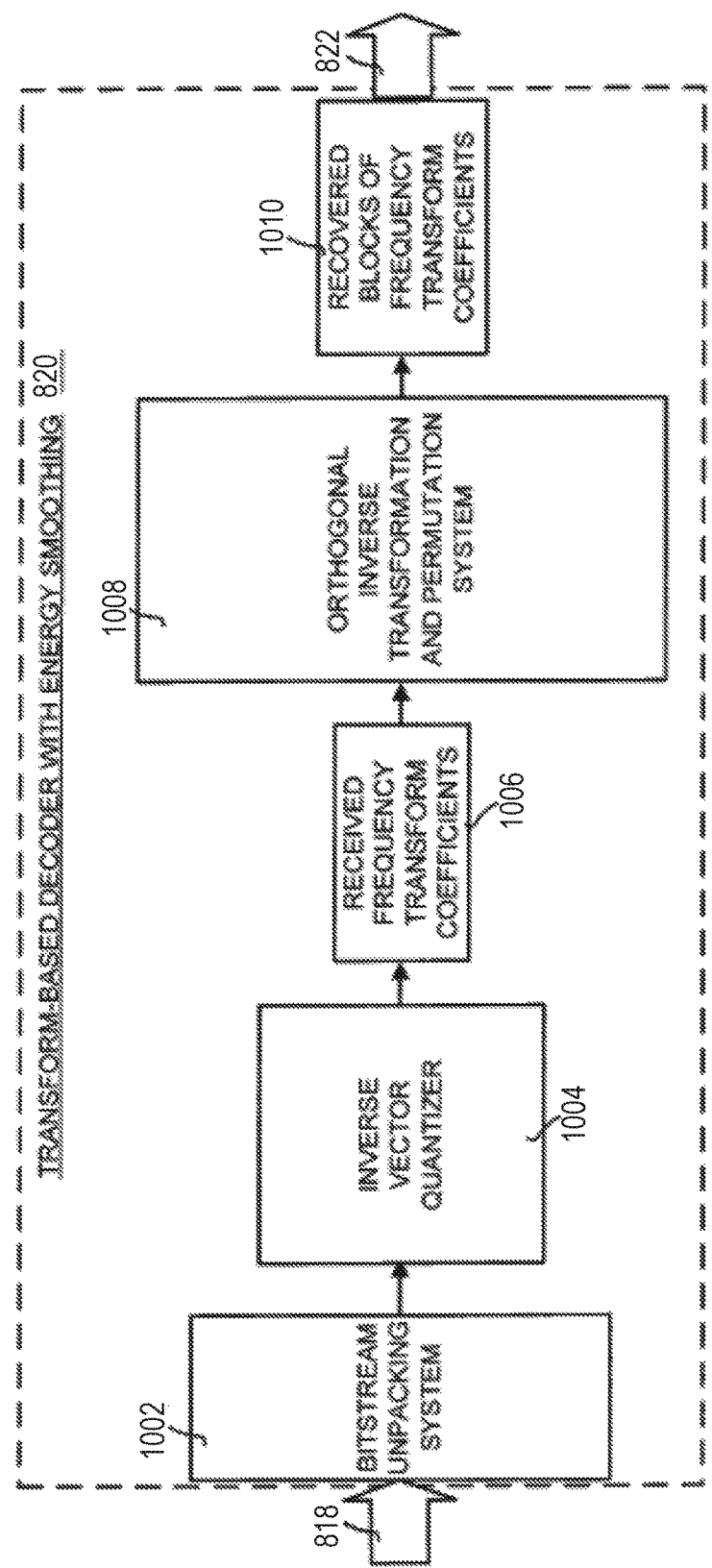
FIG. 10 is a diagram that shows further details for an embodiment of the decoder of FIG. 8.

FIG. 10 shows further details for the transform-based decoder with energy smoothing 820 of FIG. 8 for an example embodiment. (Note that energy smoothing may be optional for some embodiments.) The decoder 820 includes a bitstream unpacking 1002 (e.g., via a bitstream-unpacking circuit) that reverses the operations of the bitstream packing system 910 and an inverse vector quantizer 1004 (e.g., an inverse-quantizer circuit) that reverses the operations of the vector quantizer 908 (similarly as the third operation 306 of FIG. 3 reverses the second operation 304 of FIG. 3). The inverse vector quantizer 1004 outputs received frequency transform coefficients 1006 that are input to an orthogonal inverse transformation and permutation system 1008 that reverses the operations of the orthogonal transformation and permutation system 904 and generates recovered blocks of frequency transform coefficients 1010 (e.g., via an inverse coefficient-processing circuit). The output of the decoder 820 is the recovered audio signal 822 (e.g., via an audio circuit).

Further details related to elements of FIGS. 8-10 including the orthogonal transformation and permutation system 904 and the orthogonal inverse transformation and permutation system 1008 are found in the related U.S. application Ser. No. 15/253,646, filed Aug. 31, 2016, and entitled "Transform-based Audio Codec and Method with Subband Energy Smoothing", which is incorporated herein by reference in its entirety.

5. Additional Embodiments

Figure 11:
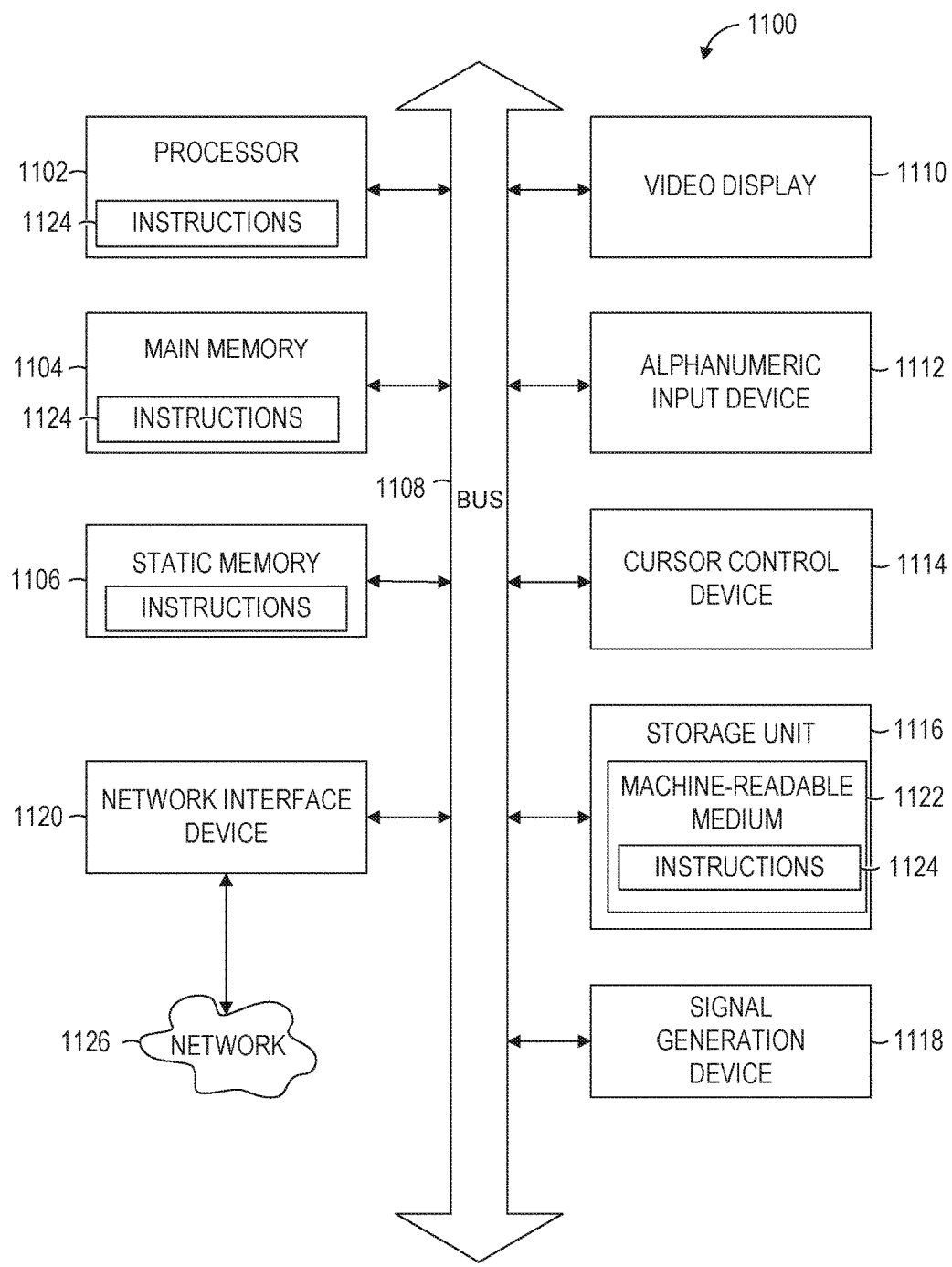
FIG. 11 is a block diagram that shows a computer processing system within which a set of instructions for causing the computer to perform any one of the methodologies discussed herein may be executed.

FIG. 11 shows a machine in the example form of a computer system 1100 within which instructions for causing the machine to perform any one or more of the methodologies discussed here may be executed. In alternative embodiments, the machine operates as a standalone device or may be connected (e.g., networked) to other machines. In a networked deployment, the machine may operate in the capacity of a server or a client machine in server-client network environment, or as a peer machine in a peer-to-peer (or distributed) network environment. The machine may be a personal computer (PC), a tablet PC, a set-top box (STB), a personal digital assistant (PDA), a cellular telephone, a web appliance, a network router, switch or bridge, or any machine capable of executing instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein.

The example computer system 1100 includes a processor 1102 (e.g., a central processing unit (CPU), a graphics processing unit (GPU) or both), a main memory 1104, and a static memory 1106, which communicate with each other via a bus 1108. The computer system 1100 may further include a video display unit 1110 (e.g., a liquid crystal display (LCD) or a cathode ray tube (CRT)). The computer system 1100 also includes an alphanumeric input device 1112 (e.g., a keyboard), a user interface (UI) cursor control device 1114 (e.g., a mouse), a storage unit 1116 (e.g., a disk drive), a signal generation device 1118 (e.g., a speaker), and a network interface device 1120.

In some contexts, a computer-readable medium may be described as a machine-readable medium. The storage unit 1116 includes a machine-readable medium 1122 on which is stored one or more sets of data structures and instructions 1124 (e.g., software) embodying or utilizing any one or more of the methodologies or functions described herein. The instructions 1124 may also reside, completely or at least partially, within the static memory 1106, within the main memory 1104, or within the processor 1102 during execution thereof by the computer system 1100, with the static memory 1106, the main memory 1104, and the processor 1102 also constituting machine-readable media. For example, the instructions 1124 may correspond to elements of any of the above-described methods or a control system that implements any of those methods.

While the machine-readable medium 1122 is shown in an example embodiment to be a single medium, the terms "machine-readable medium" and "computer-readable medium" may each refer to a single storage medium or multiple storage media (e.g., a centralized or distributed database, and/or associated caches and servers) that store the one or more sets of data structures and instructions 1124. These terms shall also be taken to include any tangible or non-transitory medium that is capable of storing, encoding or carrying instructions for execution by the machine and that cause the machine to perform any one or more of the methodologies disclosed herein, or that is capable of storing, encoding or carrying data structures utilized by or associated with such instructions. These terms shall accordingly be taken to include, but not be limited to, solid-state memories, optical media, and magnetic media. Specific examples of machine-readable or computer-readable media include non-volatile memory, including by way of example semiconductor memory devices, e.g., erasable programmable read-only memory (EPROM), electrically erasable programmable read-only memory (EEPROM), and flash memory devices; magnetic disks such as internal hard disks and removable disks; magneto-optical disks; compact disc read-only memory (CD-ROM) and digital versatile disc read-only memory (DVD-ROM). However, the terms "machine-readable medium" and "computer-readable medium" are intended to specifically exclude non-statutory signals per se.

The instructions 1124 may further be transmitted or received over a communications network 1126 using a transmission medium. The instructions 1124 may be transmitted using the network interface device 1120 and any one of a number of well-known transfer protocols (e.g., hypertext transfer protocol (HTTP)). Examples of communication networks include a local area network (LAN), a wide area network (WAN), the Internet, mobile telephone networks, plain old telephone (POTS) networks, and wireless data networks (e.g., WiFi and WiMax networks). The term "transmission medium" shall be taken to include any intangible medium that is capable of storing, encoding or carrying instructions for execution by the machine, and includes digital or analog communications signals or other intangible media to facilitate communication of such software.

Certain embodiments are described herein as including logic or a number of components, modules, or mechanisms. Modules may constitute either software modules or hardware-implemented modules. A hardware-implemented module is a tangible unit capable of performing certain operations and may be configured or arranged in a certain manner. In example embodiments, one or more computer systems (e.g., a standalone, client or server computer system) or one or more processors may be configured by software (e.g., an application or application portion) as a hardware-implemented module that operates to perform certain operations as described herein.

In various embodiments, a hardware-implemented module (e.g., a computer-implemented module) may be implemented mechanically or electronically. For example, a hardware-implemented module may comprise dedicated circuitry or logic that is permanently configured (e.g., as a special-purpose processor, such as a field programmable gate array (FPGA) or an application-specific integrated circuit (ASIC)) to perform certain operations. A hardware-implemented module may also comprise programmable logic or circuitry (e.g., as encompassed within a general-purpose processor or other programmable processor) that is temporarily configured by software to perform certain operations. It will be appreciated that the decision to implement a hardware-implemented module mechanically, in dedicated and permanently configured circuitry, or in temporarily configured circuitry (e.g., configured by software) may be driven by cost and time considerations.

Accordingly, the term "hardware-implemented module" (e.g., a "computer-implemented module") should be understood to encompass a tangible entity, be that an entity that is physically constructed, permanently configured (e.g., hardwired), or temporarily or transitorily configured (e.g., programmed) to operate in a certain manner and/or to perform certain operations described herein. Considering embodiments in which hardware-implemented modules are temporarily configured (e.g., programmed), each of the hardware-implemented modules need not be configured or instantiated at any one instance in time. For example, where the hardware-implemented modules comprise a general-purpose processor configured using software, the general-purpose processor may be configured as respective different hardware-implemented modules at different times. Software may accordingly configure a processor, for example, to constitute a particular hardware-implemented module at one instance of time and to constitute a different hardware-implemented module at a different instance of time.

Hardware-implemented modules can provide information to, and receive information from, other hardware-implemented modules. Accordingly, the described hardware-implemented modules may be regarded as being communicatively coupled. Where multiple of such hardware-implemented modules exist contemporaneously, communications may be achieved through signal transmission (e.g., over appropriate circuits and buses) that connect the hardware-implemented modules. In embodiments in which multiple hardware-implemented modules are configured or instantiated at different times, communications between such hardware-implemented modules may be achieved, for example, through the storage and retrieval of information in memory structures to which the multiple hardware-implemented modules have access. For example, one hardware-implemented module may perform an operation and store the output of that operation in a memory device to which it is communicatively coupled. A further hardware-implemented module may then, at a later time, access the memory device to retrieve and process the stored output. Hardware-implemented modules may also initiate communications with input or output devices and may operate on a resource (e.g., a collection of information).

The various operations of example methods described herein may be performed, at least partially, by one or more processors that are temporarily configured (e.g., by software) or permanently configured to perform the relevant operations. Whether temporarily or permanently configured, such processors may constitute processor-implemented modules that operate to perform one or more operations or functions. The modules referred to herein may, in some example embodiments, comprise processor-implemented modules.

Similarly, the methods described herein may be at least partially processor-implemented. For example, at least some of the operations of a method may be performed by one or more processors or processor-implemented modules. The performance of certain of the operations may be distributed among the one or more processors, not only residing within a single machine, but deployed across a number of machines. In some example embodiments, the processor or processors may be located in a single location (e.g., within a home environment, an office environment or as a server farm), while in other embodiments the processors may be distributed across a number of locations.

The one or more processors may also operate to support performance of the relevant operations in a "cloud computing" environment or as a "software as a service" (SaaS). For example, at least some of the operations may be performed by a group of computers (as examples of machines including processors), these operations being accessible via a network (e.g., the Internet) and via one or more appropriate interfaces (e.g., application program interfaces (APIs)).

6. Conclusion

Although only certain embodiments have been described in detail above, those skilled in the art will readily appreciate that many modifications are possible without materially departing from the novel teachings of this disclosure. For example, aspects of embodiments disclosed above can be combined in other combinations to form additional embodiments. Accordingly, all such modifications are intended to be included within the scope of this disclosure.

What is claimed is:

1. A method of processing audio signals, the method comprising:
   accessing an input audio signal from an audio source;
   encoding the input audio signal by determining a plurality of encoded values, an encoded value of the plurality of encoded values including a first portion and a second portion, the first portion including an index to an element of an unsigned pyramid that is defined by a vector size and a quantization parameter, and the second portion including a corresponding sign value for each nonzero component of the element of the unsigned pyramid;
   decoding the plurality of encoded values in accordance with the encoding of the input audio signal to generate an output audio signal; and
   providing the output audio signal to an audio player.

2. The method of claim 1, wherein the unsigned pyramid includes a plurality of vectors of the vector size, and each of the plurality of vectors of the unsigned pyramid having non-negative integral vector components with a sum of the non-negative integral vector components being equal to the quantization parameter.

3. The method of claim 1, wherein the encoded value of the plurality of encoded values identifies an element of a signed pyramid that is defined by the vector size and the quantization parameter, a nonzero component of the unsigned-pyramid element having a magnitude value and a sign value, the magnitude value being identified from a corresponding component of the signed-pyramid element that is indexed by the first portion of the encoded value, and the sign value being identified from the second portion of the encoded value.

4. The method of claim 1; wherein
   the first portion includes a first sequence of bits, a length of the first sequence being selected from one or more values based on a size of the unsigned pyramid; and
   the second portion includes a second sequence of bits, a variable length of the second sequence being based on the number of nonzero components of a corresponding element of a related signed pyramid that is defined by the vector size and the quantization parameter.

5. The method of claim 1, wherein
   the first portion includes a first sequence of bits, a length of the first sequence being selected from one or more values based on a size of the unsigned pyramid, the unsigned pyramid including a plurality of vectors of the vector size, and each of the plurality of vectors of the unsigned pyramid having non-negative integral vector elements with a sum of the non-negative integral vector elements being equal to the quantization parameter; and
   the second portion includes a second sequence of bits, a variable length of the second sequence being based on the number of nonzero components of a corresponding element of a related signed pyramid that is defined by the vector size and the quantization parameter, the related signed pyramid including a plurality of vectors of the vector size, and each of the plurality of vectors of the signed pyramid having integral vector elements with a sum of magnitudes of the integral vector elements being equal to the quantization parameter.

6. The method of claim 1, wherein determining the encoded value of the plurality of encoded values includes:
   identifying an element of a signed pyramid that is defined by the vector size and the quantization parameter
   determining the first portion of the encoded value to identify the unsigned-pyramid element so that a magnitude of a nonzero component of the unsigned-pyramid element is equivalent to a magnitude of a corresponding component of the signed-pyramid element; and
   determining the second portion of the encoded value so that the sign value associated with the nonzero component of the unsigned-pyramid element is equivalent to a sign value for the corresponding component of the signed-pyramid element.

7. The method of claim 1, wherein determining the encoded value of the plurality of encoded values includes:
  calculating frequency-transform coefficients based on an application of the input audio signal to a Modified Discrete Cosine Transform (MDCT);
  quantizing a vector of the frequency-transform coefficients with the quantization parameter to determine an element of a signed pyramid that is defined by the vector size and the quantization parameter; and
  determining the first portion and the second portion of the encoded value from the element of the signed pyramid, the first portion identifying a corresponding element of the unsigned pyramid and the second portion characterizing sign values for nonzero components of the element of the signed pyramid.

8. The method of claim 1, wherein decoding the plurality of encoded values includes:
  determining quantized frequency-transform coefficients from the plurality of encoded values, corresponding quantized frequency-transform coefficients being determined from the encoded value of the plurality of encoded values by using the using the first and second portions of the encoded value to identify an element of a signed pyramid that corresponds to the unsigned pyramid for the vector size and quantization parameter, the identified element of the signed pyramid including sign values that are identified from the second portion of the encoded value; and
  generating the output audio signal from the quantized frequency-transform coefficients.

9. The method of claim 1, further comprising:
  packing the plurality of encoded values into a bitstream at a first location that is associated with the encoding;
  transmitting the bitstream from the first location that is associated with the encoding to a second location that is associated with the decoding; and
  unpacking the plurality of encoded values from the bitstream at the second location that is associated with the decoding.

10. A system for processing audio signals, the system comprising:
  an input unit configured to access an input audio signal from an audio source;
  an encoder including one or more processors configured to perform operations including:
  encoding the input audio signal by determining a plurality of encoded values, an encoded value of the plurality of encoded values including a first portion and a second portion, the first portion including an index to an element of an unsigned pyramid that is defined by a vector size and a quantization parameter, and the second portion including a corresponding sign value for each nonzero component of the element of the unsigned pyramid;
  a decoder including one or more processors configured to perform operations including:
  decoding the plurality of encoded values in accordance with the encoding of the input audio signal to generate an output audio signal; and
  an output unit configured to provide the output audio signal to an audio player.

11. The system of claim 10, wherein decoding the plurality of encoded values includes:
  determining quantized frequency-transform coefficients from the plurality of encoded values, corresponding quantized frequency-transform coefficients being determined from the encoded value of the plurality of encoded values by using the using the first and second portions of the encoded value to identify an element of a signed pyramid that corresponds to the unsigned pyramid for the vector size and quantization parameter, the identified element of the signed pyramid including sign values that are identified from the second portion of the encoded value; and
  generating the output audio signal from the quantized frequency-transform coefficients.

12. A method of processing audio signals, the method comprising:
  accessing a plurality of encoded values for an input audio signal, an encoded value of the plurality of encoded values including a first portion and a second portion, the first portion including an index to an element of an unsigned pyramid that is defined by a vector size and a quantization parameter, and the second portion including a corresponding sign value for each nonzero component of the element of the unsigned pyramid;
  determining quantized frequency-transform coefficients from the plurality of encoded values, corresponding frequency-transform coefficients being determined from the encoded value of the plurality of encoded values by using the first and second portions of the encoded value to identify an element of a signed pyramid that corresponds to the unsigned pyramid for the vector size and quantization parameter, the identified element of the signed pyramid including sign values that are identified from the second portion of the encoded values; and
  generating an output audio signal from the quantized frequency-transform coefficients.

13. The method of claim 12, wherein the unsigned pyramid includes a plurality of vectors of the vector size, and each of the plurality of vectors of the unsigned pyramid having non-negative integral vector components with a sum of the non-negative integral vector components being equal to the quantization parameter.

14. The method of claim 12, wherein the encoded value of the plurality of encoded values identifies an element of a signed pyramid that is defined by the vector size and the quantization parameter, a nonzero component of the unsigned-pyramid element having a magnitude value and a sign value, the magnitude value being identified from a corresponding component of the signed-pyramid element that is indexed by the first portion of the encoded value, and the sign value being identified from the second portion of the encoded value.

15. The method of claim 12, wherein
  the first portion includes a first sequence of bits, a length of the first sequence being selected from one or more values based on a size of the unsigned pyramid; and
  the second portion includes a second sequence of bits, a variable length of the second sequence being based on the number of nonzero components of a corresponding element of a related signed pyramid that is defined by the vector size and the quantization parameter.

16. The method of claim 12, wherein
  the first portion includes a first sequence of bits, a length of the first sequence being selected from one or more values based on a size of the unsigned pyramid, the unsigned pyramid including a plurality of vectors of the vector size, and each of the plurality of vectors of the unsigned pyramid having non-negative integral vector elements with a sum of the non-negative integral vector elements being equal to the quantization parameter; and the second portion includes a second sequence of bits, a variable length of the second sequence being based on the number of nonzero components of a corresponding element of a related signed pyramid that is defined by the vector size and the quantization parameter, the related signed pyramid including a plurality of vectors of the vector size, and each of the plurality of vectors of the signed pyramid having integral vector elements with a sum of magnitudes of the integral vector elements being equal to the quantization parameter.

17. A transform-based audio signal encoder comprising:
a frequency-transform circuit configured to calculate frequency-transform coefficients from an input audio signal;
a coefficient-processing circuit configured to determine a plurality of coefficient blocks of the frequency-transform coefficients;
a quantizer circuit configured to determine an encoded value for a coefficient block of the plurality of coefficient blocks, the encoded value including a first portion and a second portion, the first portion including an index to an element of an unsigned pyramid that is defined by a vector size of the coefficient block and a quantization parameter that corresponds to a resolution of the quantizer circuit, and the second portion including a corresponding sign value for each nonzero component of the element of the unsigned pyramid; and
a bitstream-packing circuit configured to generate an encoded bitstream from a plurality of encoded values determined by the quantizer circuit for the plurality of coefficient blocks, wherein the bitstream is a digital representation of the frequency domain transform of the input audio signal.

18. The transform-based encoder of claim 17, wherein the coefficient-processing circuit is further configured to perform an orthogonal transformation and permutation of the frequency-transform coefficients into separate frequency bands for the plurality of coefficient blocks.

19. A transform-based audio signal decoder comprising:
a bitstream-unpacking circuit configured to determine a plurality of encoded values from an encoded bitstream, wherein the bitstream is a digital representation of the frequency domain transform of the input audio signal an encoded value of the plurality of encoded values including a first portion and a second portion, the first portion including an index to an element of an unsigned pyramid that is defined by a vector size and a quantization parameter, and the second portion including a corresponding sign value for each nonzero component of the element of the unsigned pyramid;
an inverse-quantizer circuit that is configured to determine a coefficient block corresponding to the vector size for a resolution corresponding to the quantization parameter from the encoded value of the plurality of encoded values, the coefficient block being determined from the encoded value of the plurality of encoded values by using the first and second portions of the encoded value to identify an element of a signed pyramid that corresponds to the unsigned pyramid for the vector size and quantization parameter, the identified element of the signed pyramid including sign values that are identified from the second portion of the encoded values;
an inverse coefficient-processing circuit configured to determine a plurality of frequency-transform coefficients from a plurality of coefficient blocks determined by the inverse-quantizer circuit for the plurality of encoded values; and
an audio circuit configured to generate an audio signal from the plurality of frequency-transform coefficients.

20. The transform-based decoder of claim 19, wherein the inverse coefficient-processing circuit is further configured to perform an inverse orthogonal transformation and permutation of the plurality of coefficient blocks to determine the plurality of frequency-transform coefficients.

* * * * *

UNITED STATES PATENT AND TRADEMARK OFFICE
CERTIFICATE OF CORRECTION

PATENT NO. : 10,366,698 B2  
APPLICATION NO. : 15/611362  
DATED : July 30, 2019  
INVENTOR(S) : Seroussi et al.

Page 1 of 1

It is certified that error appears in the above-identified patent and that said Letters Patent is hereby corrected as shown below:

On the Title Page

On page 2, in Column 1, item (56), under "Other Publications", Line 1, delete "HIgh-Quality" and insert --High-Quality-- therefor In the Claims In Column 14, Line 25, in Claim 4, delete "claim 1;" and insert --claim 1,-- therefor In Column 14, Line 56, in Claim 6, after "parameter", insert --;--

In Column 15, Line 22, in Claim 8, delete "using the using the" and insert --using the-- therefor In Column 16, Line 1, in Claim 11, delete "using the using the" and insert --using the-- therefor Signed and Sealed this  
Third Day of November, 2020

Andrei Iancu  
*Director of the United States Patent and Trademark Office*